US011626557B2

(12) United States Patent
Parsche (10) Patent No.: US 11,626,557 B2
(45) Date of Patent: Apr. 11, 2023

(54) ULTRA-MINIATURE ANTENNAS

(71) Applicant: Eagle Technology, LLC, Melbourne, FL (US)

(72) Inventor: Francis Parsche, Palm Bay, FL (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 881 days.

(21) Appl. No.: 16/556,974

(22) Filed: Aug. 30, 2019

(65) Prior Publication Data

US 2021/0066573 A1 Mar. 4, 2021

(51) Int. Cl.
*H01Q 1/24* (2006.01)
*H01L 41/09* (2006.01)
*H01L 41/187* (2006.01)
*H01L 41/311* (2013.01)

(52) U.S. Cl.
CPC ...... *H01L 41/0973* (2013.01); *H01L 41/1876* (2013.01); *H01L 41/311* (2013.01); *H01Q 1/243* (2013.01)

(58) Field of Classification Search
CPC .......... H01Q 1/007; H01Q 1/22; H01Q 1/243; H01Q 3/44
See application file for complete search history.

(56) References Cited

U.S. PATENT DOCUMENTS

| | | | | |
|---|---|---|---|---|
| 4,352,961 A * | 10/1982 | Kumada | ................ | H04R 17/00 368/255 |
| 6,963,310 B2 * | 11/2005 | Horita | .................... | H01Q 1/243 343/702 |
| 8,596,862 B1 * | 12/2013 | Pfeifer | .................. | G01K 17/00 374/117 |
| 9,196,964 B2 | 11/2015 | Baringer | | |
| 9,219,529 B2 * | 12/2015 | Akiyama | ............. | H04B 5/0081 |
| 2008/0153416 A1 * | 6/2008 | Washiro | .................. | H01P 5/085 455/41.1 |
| 2011/0006864 A1 * | 1/2011 | Kato | ........................ | H01P 5/00 333/24 R |
| 2020/0204283 A1 * | 6/2020 | Mason | .................... | G01S 1/245 |

OTHER PUBLICATIONS

Martin, B., "Ultra-small antennas point way to miniature brain implants," Nature, International Weekly Journal of Science, Aug. 23, 2017.

(Continued)

*Primary Examiner* — Tung X Le
(74) *Attorney, Agent, or Firm* — Fox Rothschild LLP; Robert J. Sacco; Carol Thorstad-Forsyth (57) ABSTRACT

Systems and methods for operating a communication device. The methods comprise: immersing an antenna in an electric field of an incident radio wave; producing a net change in electrical charge on a surface of an electrodeformative element that acoustically vibrates when the antenna is immersed in the electric field of the incident radio wave; harvesting the electrical charge produced on the surface of the electrodeformative element to provide an antenna receive function; and providing the harvested electrical charge from the antenna to a receiver circuit of the communication device.

24 Claims, 11 Drawing Sheets

(56) References Cited

OTHER PUBLICATIONS

Sinha, D., et al., "Antenna Miniaturisation Using Piezoelectric Material Based Thin Film Antenna for Body-centric Wireless Communications," 2016 IEEE International Symposium on Radio-Frequency Integration Technology (RFIT).
Hutson, M., "Mini-Antennas could brain-computer interfaces, medical devices," Science Magazine, Aug. 22, 2017.
Mraz, S., USAF Learns How to Shrink Antennas, MachineDesign, Oct. 9, 2017.
Lin, H., "Future Antenna Miniaturization Mechanism: Magnetoelectric Antennas," Create the Future Design Contest, Produced by Tech Briefs, 2018.
University of Cambridge, "New Understanding of Electromagnetism Could Enable 'Antennas on a Chip'", PhysOrg, Apr. 8, 2015.
Pacini, A., et al., "A Theoretical and Numerical Approach for Selecting Miniaturized Antenna Topologies on Magneto-Dielectric Substances," 2014 44th European Microwave Conference, 2014.
Domann, J.P., et al., "Strain Powered Antenna," Department of Mechanical and Aerospace Engineering, University of California, Los Angeles, Oct. 13, 2016.

* cited by examiner

ULTRA-MINIATURE ANTENNAS

BACKGROUND

Statement of the Technical Field

The present disclosure relates generally to communication devices. More particularly, the present disclosure relates to ultra-miniature antennas.

Description of the Related Art

Navigation systems have been developed for facilitating the navigation of aircrafts, watercrafts and land based vehicles. The navigation systems include radio location systems, Global Positioning Systems ("GPSs"), and satellite based systems. These navigation systems are vulnerable to jamming which is not desirable for commercial aviation applications and military applications.

SUMMARY

The present disclosure concerns implementing systems and methods for operating a communication device (e.g., a navigation receiver (e.g., an eLoran receiver), a radio, or a smart phone). The methods comprise: immersing an antenna in an electric field of an incident radio wave; producing a net change in electrical charge on a surface of an electrodeformative element that acoustically vibrates when the antenna is immersed in the electric field of the incident radio wave (e.g., a radio wave having a frequency between 50 kHz and 200 kHz); harvesting the electrical charge produced on the surface of the electrodeformative element to provide an antenna receive function; and providing the harvested electrical charge from the antenna to a receiver circuit of the communication device.

The electrodeformative element is acoustically suspended in a housing of the antenna by a plurality of suspension members. The suspension members include, but are not limited to, coil springs, spring wires, wire carriers, compressible pads (e.g., foam pads), and/or elastomeric elements (e.g., rubber pieces). A suspension member resides on some or all sides of the electrodeformative element. In some scenarios, at least one sidewall of the antenna's housing is used to directly (1) facilitate a retention of the electrodeformative element in the housing and (2) suspend the electrodeformative element in the housing.

The electrodeformative element is formed of an electrodeformative material. The electrodeformative material includes, but is not limited to, lead zirconate titanate, barium titanate, metallic oxide-based materials, a quartz material, ceramics, and/or any other material with elongate polarized molecules. The electrodeformative material may be in a bulk vibration mode.

In some scenarios, the methods also comprise: adjusting a resistance of the antenna by changing a distance between two electrical contacts disposed on a surface of the electrodeformative element; disposing a mechanical tuning mass on the electrodeformative element to decrease an operating frequency of the electrodeformative element; and/or sizing the electrodeformative element in accordance with a speed of sound. The mechanical tuning mass includes, but is not limited to, paint, a pencil marking, a lead rubbing, a graphite rubbing, a solder rubbing, an adhesively attached piece, glue and/or a sticker.

The present solution also concerns an antenna for receiving radio waves. The antenna comprises: a housing; an electrodeformative element that is disposed in the housing and vibrates when the antenna is immersed in an electric field of an incident radio wave; and electrical elements that harvest an electrical charge produced on a surface of the electrodeformative element when the electrodeformative element vibrates to provide an antenna receive function. A transmission line can be provided to facilitate a provision of the harvested electrical charge from the antenna to a receiver circuit of a communication device.

BRIEF DESCRIPTION OF THE DRAWINGS

The present solution will be described with reference to the following drawing figures, in which like numerals represent like items throughout the figures.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present solution may be embodied in other specific forms without departing from its spirit or essential characteristics. The described embodiments are to be considered in all respects only as illustrative and not restrictive. The scope of the present solution is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present solution should be or are in any single embodiment of the present solution. Rather, language referring to the features and advantages is understood to mean that a specific feature, advantage, or characteristic described in connection with an embodiment is included in at least one embodiment of the present solution. Thus, discussions of the features and advantages, and similar language, throughout the specification may, but do not necessarily, refer to the same embodiment.

Furthermore, the described features, advantages and characteristics of the present solution may be combined in any suitable manner in one or more embodiments. One skilled in the relevant art will recognize, in light of the description herein, that the present solution can be practiced without one or more of the specific features or advantages of a particular embodiment. In other instances, additional features and advantages may be recognized in certain embodiments that may not be present in all embodiments of the present solution.

Reference throughout this specification to "one embodiment", "an embodiment", or similar language means that a particular feature, structure, or characteristic described in connection with the indicated embodiment is included in at least one embodiment of the present solution. Thus, the phrases "in one embodiment", "in an embodiment", and similar language throughout this specification may, but do not necessarily, all refer to the same embodiment.

As used in this document, the singular form "a", "an", and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to".

There is a need for a navigation system that is resistant to jamming. One such navigation system is a land based portable system known as eLoran. eLoran navigation systems use relatively strong Radio Frequency ("RF") signals with relatively low frequencies (e.g., 90 kHz to 110 kHz). During operation, an eLoran signal needs to be received at the portable eLoran product. Antennas are typically sized according to the wavelength. An antenna for RF signals at 100 kHz would need to be 3,000 meters in length. Such a 3,000 meter long antenna is impractical for a portable product. The prior art eLoran antennas typically comprise a copper coil or a copper wire wound around a ferrite rod. These copper antennas are inefficient at electrically small size. When the antenna has a small relative wavelength, the signal gets lost due to the increased temperature of the copper wire. Therefore, there is a need for a more efficient antenna which provides a stronger signal and has a decreased overall size for a portable receiving apparatus.

Accordingly, the present solution concerns ultra-miniature antennas for communication devices (e.g., the eLoran navigation system and/or a smart phone). The ultra-miniature antennas comprise electrodeformative antenna elements that are acoustically resonant at a low operating frequency range (e.g., 50 kHz to 200 kHz). The electrodeformative material responds to electric fields and produces electric fields. When a radio wave passes by the antenna element, the electrodeformative material vibrates and produces a net change in electrical charge on its surface. The antenna element is mechanically suspended inside a dielectric housing so that it can vibrate when immersed in an electric field of the incident radio wave. This electrical charge is harvested by electrical elements (e.g., conductive contacts) so as to provide an antenna receive function. The harvested electrical charge is then provided to a receiver.

The present solution is discussed herein in relation to communication systems for transmitting and receiving communication signals. The present solution is not limited in this regard. The present solution can be used in other applications such as radio controlled clock applications, broadcast reception applications, telemetry applications, and/or wireless transmission of RF power applications.

Figure 1:
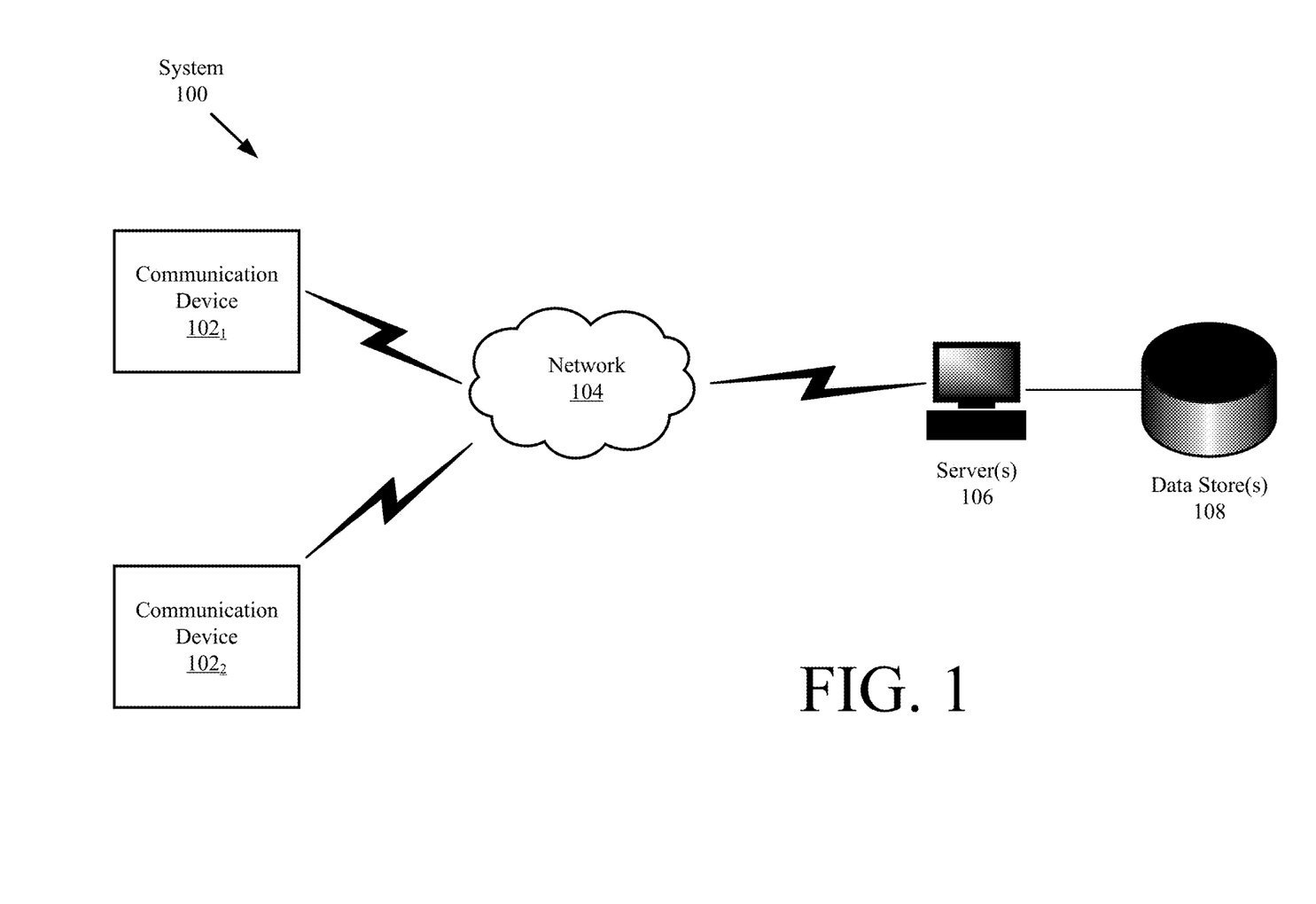
FIG. 1 is a perspective view of an illustrative system.

Referring now to FIG. 1, there is provided a schematic illustration of an illustrative system 100 implementing the ultra-miniature antennas of the present solution. System 100 comprises a communication devices $102_1, \ldots, 102_N$, a network 104, server(s) 106 and data store(s) 108. The communication devices 106 are configured to wirelessly communication with each other and the server(s) 106 via the network 104. The network (104) includes, but is not limited to, the Internet, a cellular network, and/or a radio network. Each of the listed networks is well known in the art, and therefore will not be described herein.

Figure 2:
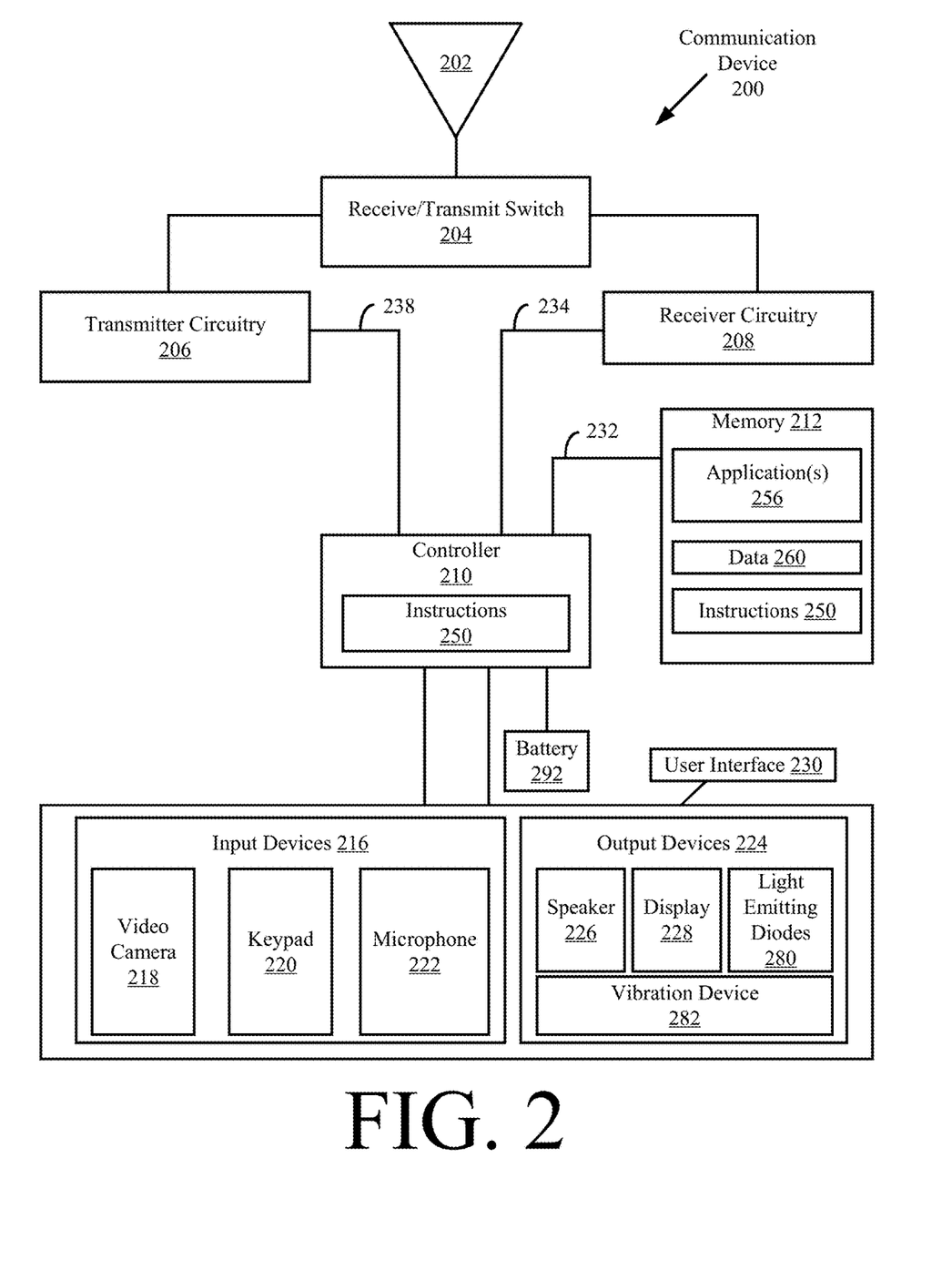
FIG. 2 is an illustration of an illustrative architecture for the communications device shown in FIG. 1.

Referring now to FIG. 2, there is provided a schematic illustration of an illustrative architecture for a communication device 200. Communication devices $102_1, \ldots, 102_N$ of FIG. 1 are the same as or similar to communication device 200. As such, the discussion of communication device 200 is sufficient for understanding communication devices $102_1, \ldots, 102_N$. The communication device 200 includes, but is not limited to, a radio, a cellular phone, a mobile phone, a smart phone, or a Navigation receiver (e.g., a Global Positioning System ("GPS") receiver or an eLoran receiver). Each of the listed devices is well known in the art, and therefore will not be described herein.

Communication device 200 may include more or less components than those shown in FIG. 2. However, the components shown are sufficient to disclose an illustrative embodiment implementing the present solution. Some or all of the components of the communication device 200 can be implemented in hardware, software and/or a combination of hardware and software. The hardware includes, but is not limited to, one or more electronic circuits.

Communication device 200 comprises an electrodeformative antenna 202 for receiving and transmitting Radio Frequency ("RF") signals. In some scenarios, the antenna 202 operates between 50 kHz and 200 kHz. The present solution is not limited to this operational frequency range. The operational frequency of the antenna 202 is adjustable through the attachment of a mechanical mass thereto. The mechanical mass includes, but is not limited to, paint, graphite, lead, solder, rubber, and other mass disposed or otherwise coupled (e.g., via an adhesive) to the electrodeformative material of the antenna.

A receive/transmit ("Rx/Tx") switch 204 selectively couples the antenna 202 to the transmitter circuitry 206 and the receiver circuitry 208 in a manner familiar to those skilled in the art. The receiver circuitry 208 demodulates and decodes the RF signals received from an external device. The receiver circuitry 208 is coupled to a controller (or microprocessor) 210 via an electrical connection 234. The receiver circuitry 208 provides the decoded signal information to the controller 210. The controller 210 uses the decoded RF signal information in accordance with the function(s) of the communication device 200. The controller 210 also provides information to the transmitter circuitry 206 for encoding and modulating information into RF signals. Accordingly, the controller 210 is coupled to the transmitter circuitry 206 via an electrical connection 238. The transmitter circuitry 206 communicates the RF signals to the antenna 202 for transmission to an external device via the Rx/Tx switch 204.

The controller 210 may store received and extracted information in memory 212 of the communication device 200. Accordingly, the memory 212 is connected to and accessible by the controller 210 through electrical connection 232. The memory 212 may be a volatile memory and/or a non-volatile memory. For example, memory 212 can include, but is not limited to, a Random Access Memory ("RAM"), a Dynamic Random Access Memory ("DRAM"), a Read Only Memory ("ROM") and a flash memory. The memory 212 may also comprise unsecure memory and/or secure memory. The memory 212 can be used to store various other types of data 260 therein, such as authentication information, cryptographic information, location information, and various article-related information.

As shown in FIG. 2, one or more sets of instructions 250 are stored in memory 212. The instructions may include customizable instructions and non-customizable instructions. The instructions 250 can also reside, completely or at least partially, within the controller 210 during execution thereof by communication device 200. In this regard, the memory 212 and the controller 210 can constitute machine-readable media. The term "machine-readable media", as used herein, refers to a single medium or multiple media that stores one or more sets of instructions 250. The term "machine-readable media", as used here, also refers to any medium that is capable of storing, encoding or carrying the set of instructions 250 for execution by the communication device 200 and that causes the communication device 200 to perform one or more of the methodologies of the present disclosure.

The controller 210 is also connected to a user interface 230. The user interface 230 comprises input devices 216, output devices 224 and software routines (not shown in FIG. 2) configured to allow a user to interact with and control software applications (e.g., software applications 256 and other software applications) installed on communication device 200. Such input and output devices may include, but are not limited to, a display 228, a speaker 226, a keypad 220, a directional pad (not shown in FIG. 2), a directional knob (not shown in FIG. 2), a microphone 222, and/or a video camera 218. The display 228 may be designed to accept touch screen inputs. As such, user interface 230 can facilitate a user software interaction for launching applications (e.g., software applications 256 and other software applications) installed on the communication device 200. The application software 256 can facilitate the communication of information between the communication device 200 and an external device (e.g., another communications device or a remote server).

Notably, the antenna 202 comprises a novel vibratory antenna element. The vibratory antenna element is used to receive RF signals at miniaturized size. The antenna 202 will now be described in relation to FIGS. 3-13.

Figure 3:
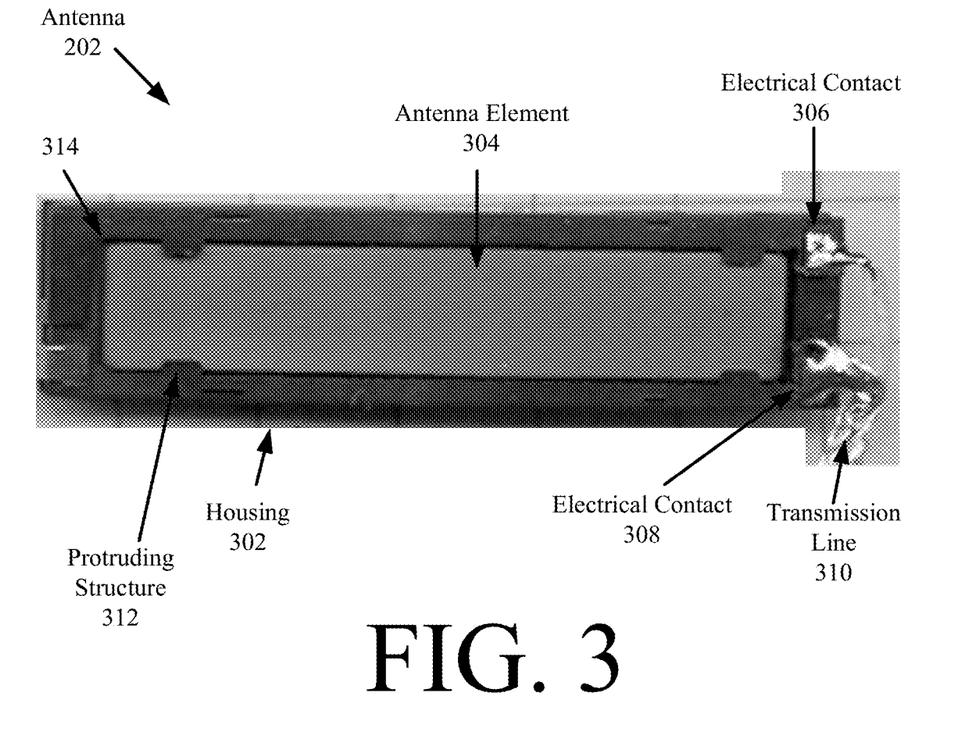
FIG. 3 is a top view of an illustrative antenna.
Figure 4:
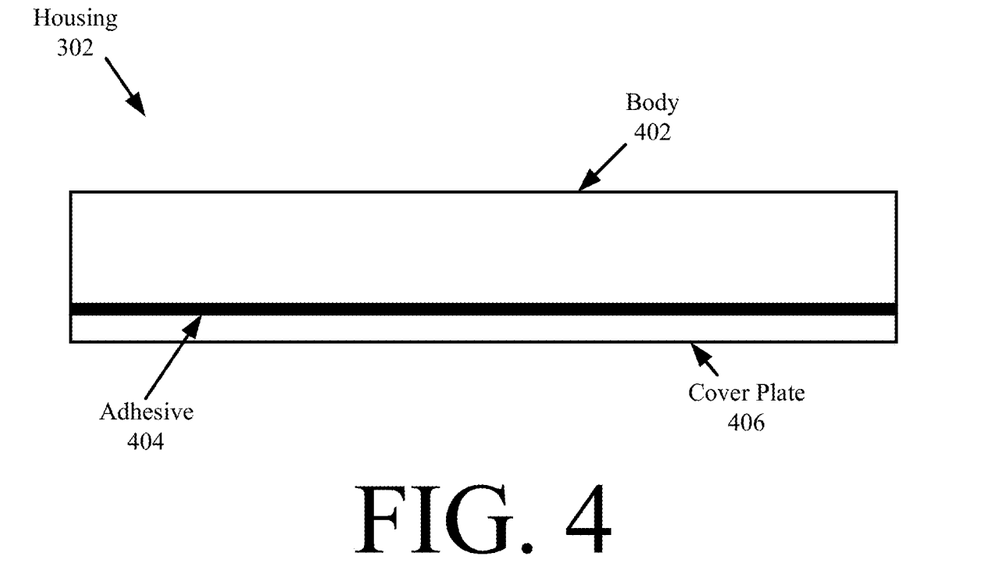
FIG. 4 is a side view of the antenna shown in FIG. 3.
Figure 5:
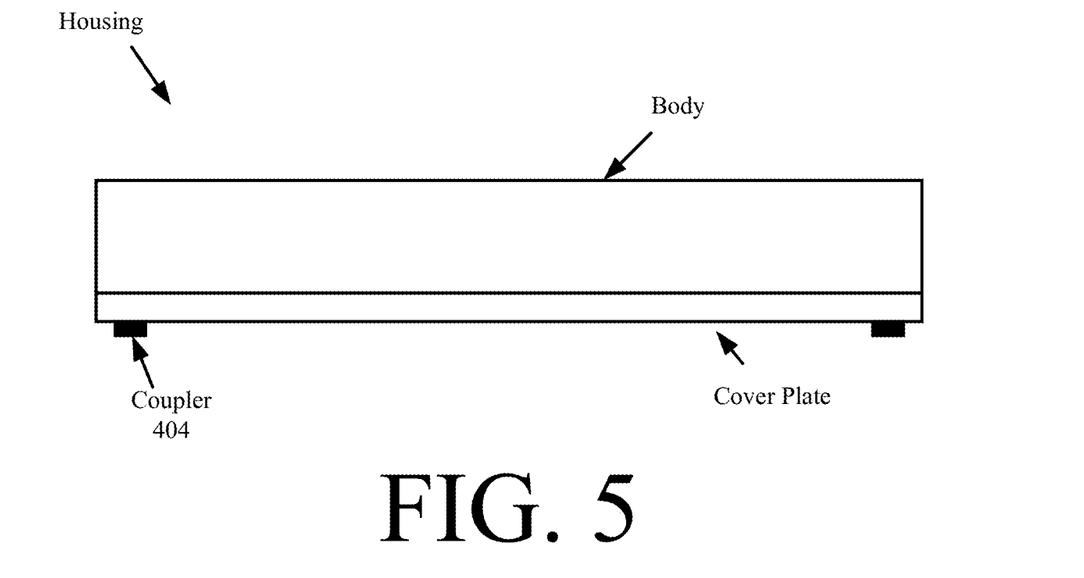
FIG. 5 is a side view of another illustrative antenna.

As shown in FIG. 3, the antenna 202 comprises an antenna element 304 and a housing 302. The housing 302 is formed of a dielectric material (e.g., plastic), and is configured to house the antenna element 304. In some scenarios, the housing 302 comprises a body 402 and a cover plate 406 coupled to the body via an adhesive 404 (as shown in FIG. 4) or other coupling means (e.g., screws 404 as shown in FIG. 5). The cover plate 406 is coupled to the body 402 after the antenna element 304 has been disposed inside a cavity 314 formed in the body 402.

Figure 10:
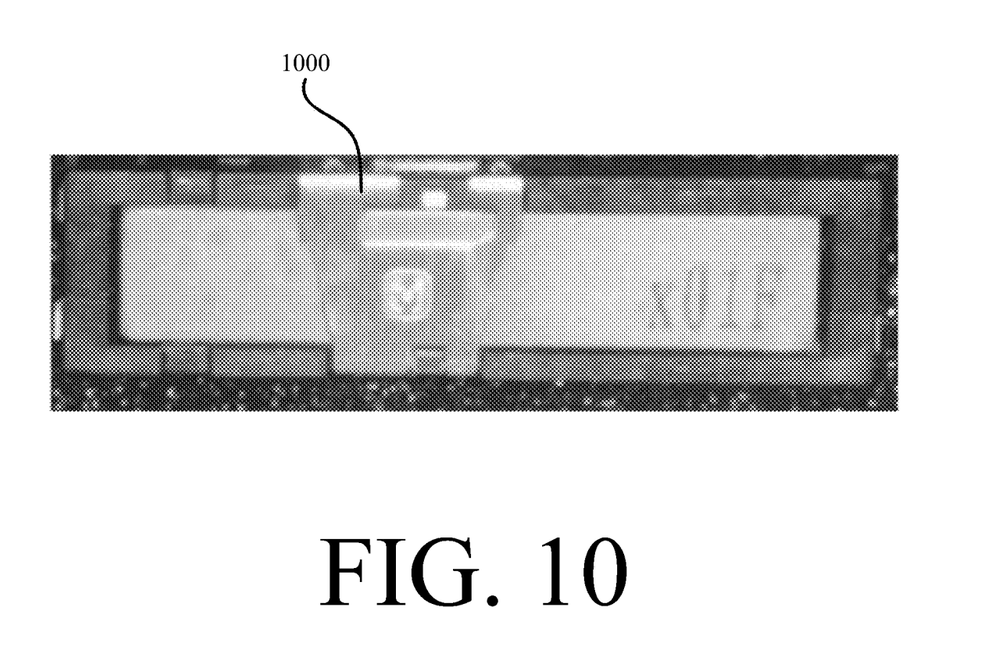
FIG. 10 is a bottom view of another antenna.

The cover plate 406 and protruding structures 312 (e.g., retention ears) mechanically retain the antenna element 304 within the cavity 314. The protruding structures 312 are integrally formed with the housing's body 402 as shown in FIG. 3. Alternatively, the protruding structures 312 are coupled to the housing's body 402 via a coupling means (e.g., via an adhesive, screw, weld, chemical bond, etc.). The present solution is not limited to this manner of retaining the antenna element 304 within the cavity 314. For example, in other scenarios, the housing 302 is absent of the cover plate 406, and protruding structures (e.g., retention ears) are provided on both opposing sides of the housing 302. The protruding structure(s) on at least one side of the housing is(are) formed of a material that can be bent or coupled to the body 402 after the antenna element 304 has been disposed inside a cavity 314 formed in the body 402. In yet other scenarios, a clip 1000 is provided instead of the cover plate 406, as shown in FIG. 10. The clip can be formed of any material, such as plastic or metal. In the case the clip is formed of a metal material, a foam pad or other dielectric material is disposed on the surface of the clip so that the clip does not directly contact the electrodeformative element when the antenna is in use.

The housing 302 is shown as having a generally rectangular shape. The present solution is not limited in this regard. The housing can have any shape and/or dimensions selected in accordance with a particular application.

The antenna element 304 is formed of a electrodeformative material that mechanically vibrates when radio waves are applied thereto. The electrodeformative material includes, but is not limited to, lead zirconate titanate, barium titanate, metallic oxide-based electrodeformative materials, a quartz material, ceramics, and/or any other material with elongate polarized molecules. The antenna element 304 is in a bulk vibration mode meaning that the entire antenna element mechanically vibrates along one axis that is in alignment with the electric field component of the incident radio wave. Accordingly in some applications (e.g., smart phone applications), two antennas 202 are provided that are arranged perpendicular to each other. In other applications, a single antenna 202 is provided when the communication device's orientation is known and not expected to change.

The antenna element 304 is acoustically resonant at a certain frequency range (e.g., 50 kHz to 200 kHz). The antenna element 304 responds to electric fields and produces electric fields. When a radio wave passes by the antenna element 304, the electrodeformative material vibrates and produces a net change in electrical charge on its surface. This electrical charge is harvested by electrical contacts 305, 308 so as to provide an antenna receive function. The harvested electrical charge is then provided to a receiver circuit (e.g., receiver circuitry 208 of FIG. 2) via the transmission line 310. The transmission line 310 can include, but is not limited to, a coaxial cable. Coaxial cables are well known in the art, and will not be described herein. Wires of the coaxial cable are soldered to the electrical contacts 306, 308, as shown in FIG. 3. The present solution is not limited in this regard. Other coupling means can be used to couple the transmission line 310 to the antenna 202.

The antenna element 304 is mechanically and/or acoustically suspended inside the dielectric housing 302 so that it can vibrate when immersed in an electric field of the incident radio wave. The mechanical and/or acoustic suspension is provided by one or more suspension members. The suspension member(s) can include, but is(are) not limited to, coil spring(s), spring wire(s), wire carrier(s) (e.g., wire carriers 900, 902 of FIG. 9), compressible pad(s) (e.g., foam pads shown in FIG. 6), elastomeric element(s) (e.g., a rubber or silicon elements), and/or other soft mechanical suspension elements. The compressible pads, elastomeric elements and/or other soft mechanical suspension elements can have any shape selected in accordance with a given application (e.g., square, rectangular, triangular, circular, etc.).

Figure 6:
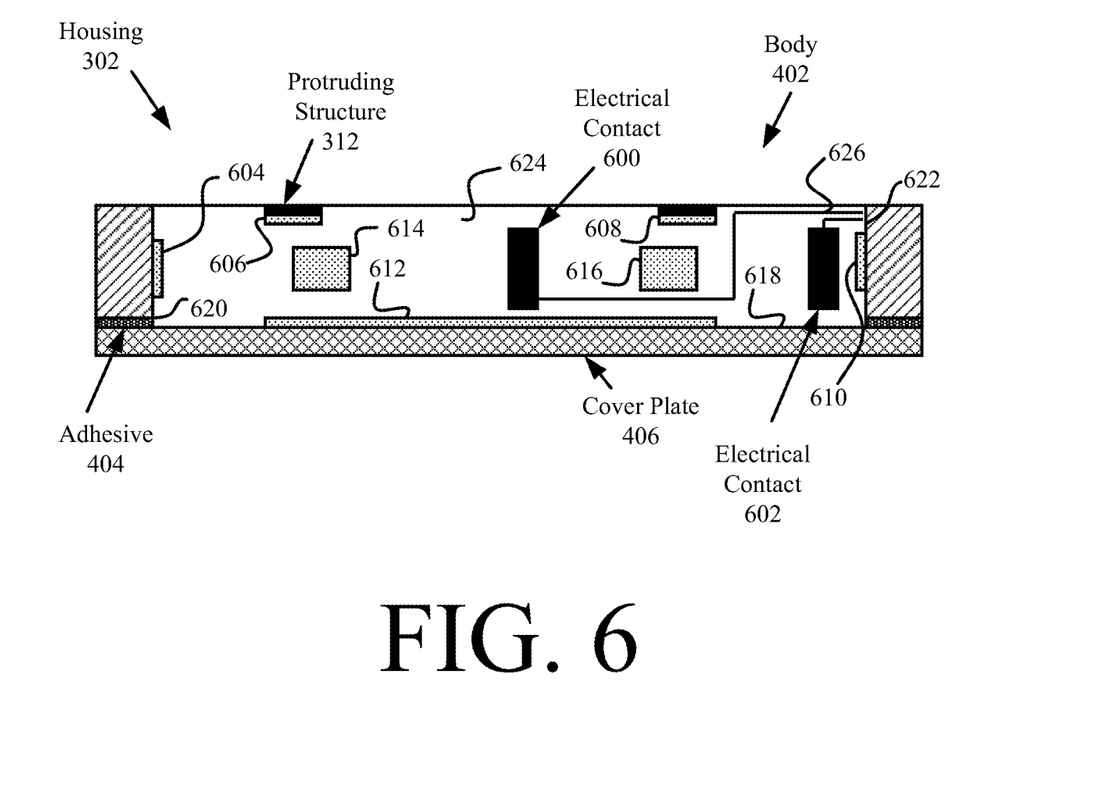
FIG. 6 is a cross-sectional view of the antenna shown in FIGS. 3-4 with the antenna element removed therefrom for ease of explanation.

The suspension members reside on one or more sides of the antenna element 304 when the antenna 202 is assembled (shown in FIG. 3). For example, as shown in FIG. 6, a first suspension member 604 is coupled to a first sidewall 620 of the body 402. Second and third suspension members 606, 608 are coupled to protrusion structures 312. A fourth suspension member 610 is coupled to a sidewall 622. A fifth suspension member 612 is coupled to the cover plate 406. Sixth and seventh suspension members 614, 616 are coupled to a sidewall 624. Other suspension members (not shown) are coupled to the last remaining sidewall (not shown). The suspension members can be of the same or different types. The present solution is not limited to the suspension member configuration shown in FIG. 6.

Figure 7:
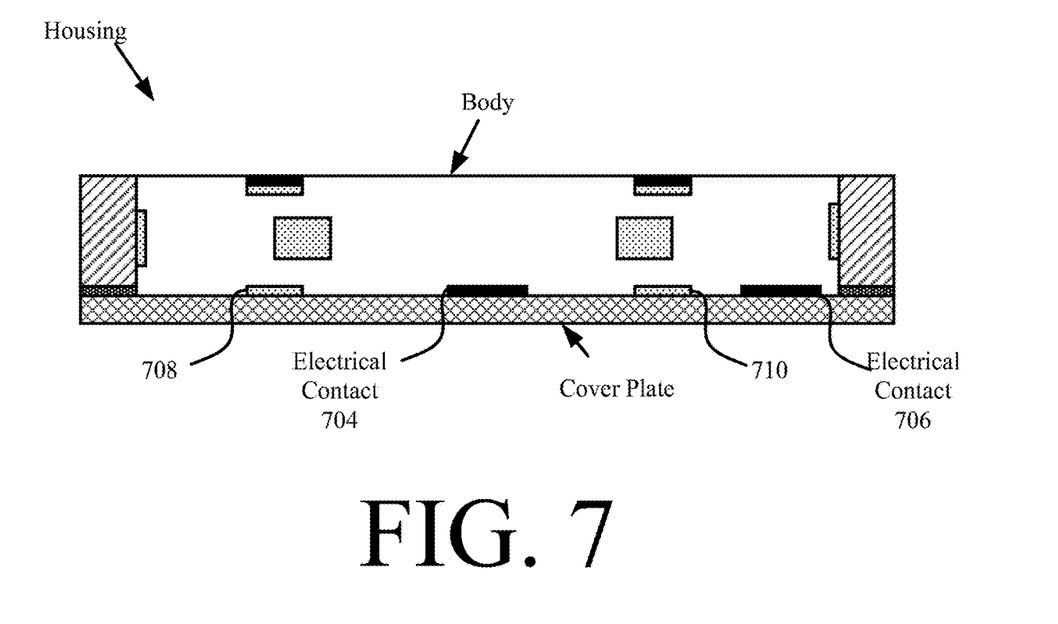
FIG. 7 is a cross-sectional view of another antenna with the antenna element removed therefrom for ease of explanation.

Any number of suspension members can be provided on the body's sidewalls and/or cover plate. In this regard, two or more suspension members 708, 710 are disposed on the sidewalls 620, 622 and/or cover plate as shown in FIG. 7, rather than just one as shown in FIG. 6. Also, a single suspension member or more than two suspension members can be provided on sidewall 624, rather than two as shown in FIG. 6. When a plurality of suspension members are provided on a given surface (e.g., of a body sidewall or the cover plate), the suspension members are arranged in a pattern selected in accordance with a given application (e.g., a grid pattern or a concentric shape pattern).

Figure 8:
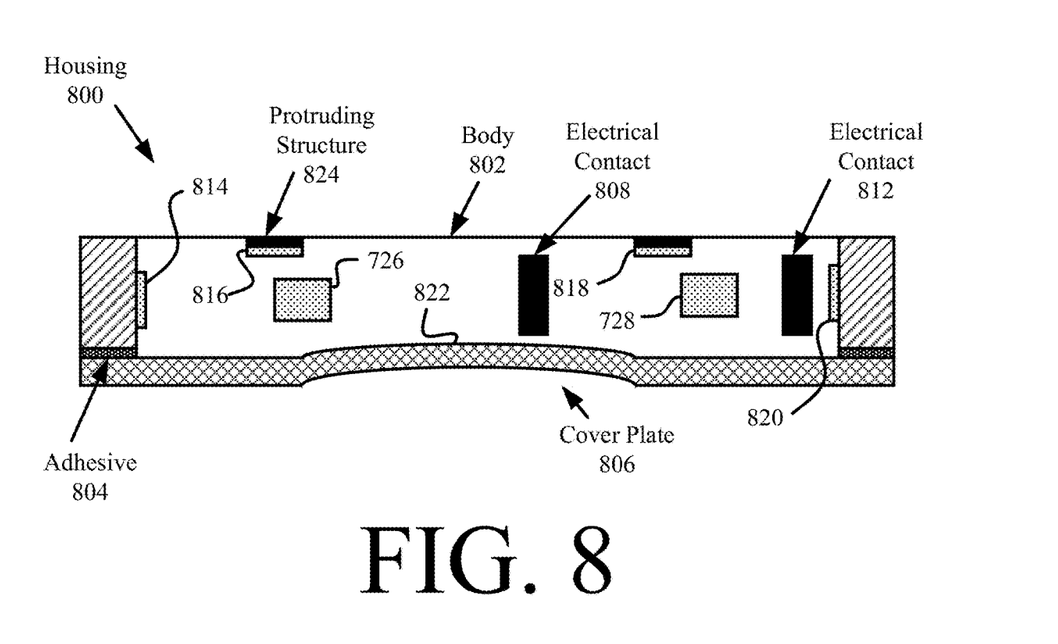
FIG. 8 is a cross-sectional view of another antenna with the antenna element removed therefrom for ease of explanation.
Figure 9:
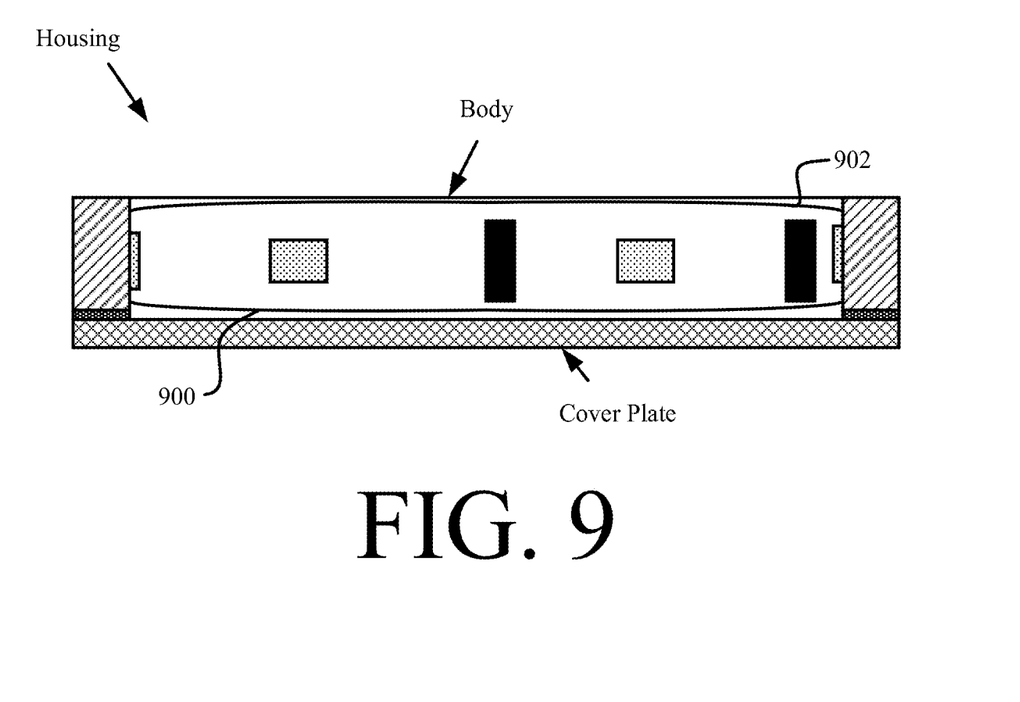
FIG. 9 is a cross-sectional view of another antenna with the antenna element removed therefrom for ease of explanation.

In other scenarios, at least one sidewall of the body and/or the cover plate is designed to have a dual purpose of (1) facilitating the retention of the antenna element 304 in the cavity 314 and (2) suspending the antenna element 304 within the cavity 314. As such, the body sidewall(s) and/or cover plate is(are) designed so that it(they) deform(s) when the antenna element vibrates during use of the antenna 202. For example as shown in FIG. 8, the cover plate 806 is formed of a deformable material (e.g., a thin metal sheet) with at least a portion thereof curved inward (or being concave) or extending inward. The present solution is not limited in this regard.

Figure 11:
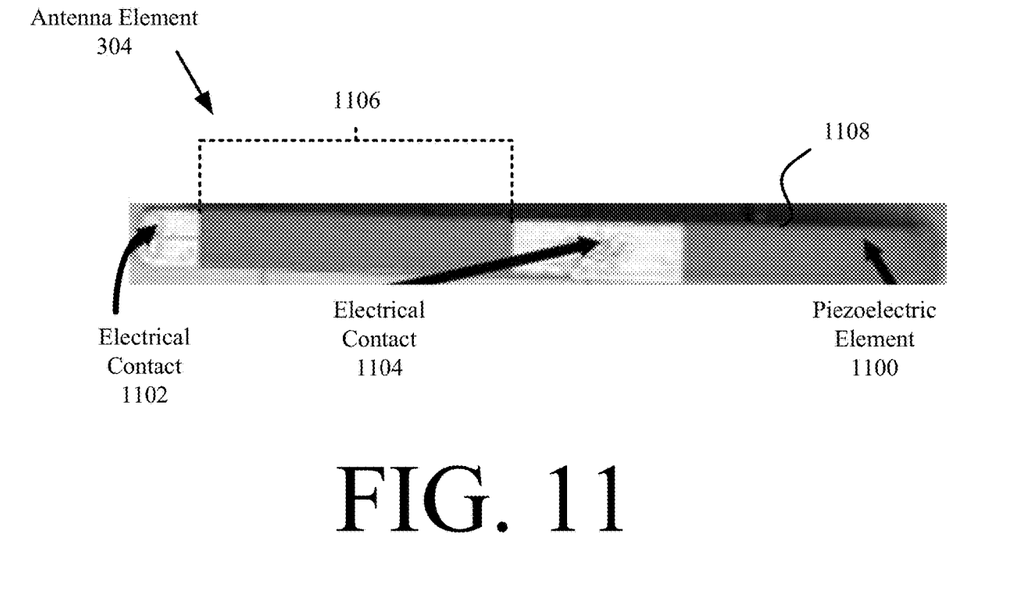
FIG. 11 is a side view of the antenna element shown in FIG. 3.
Figure 12:
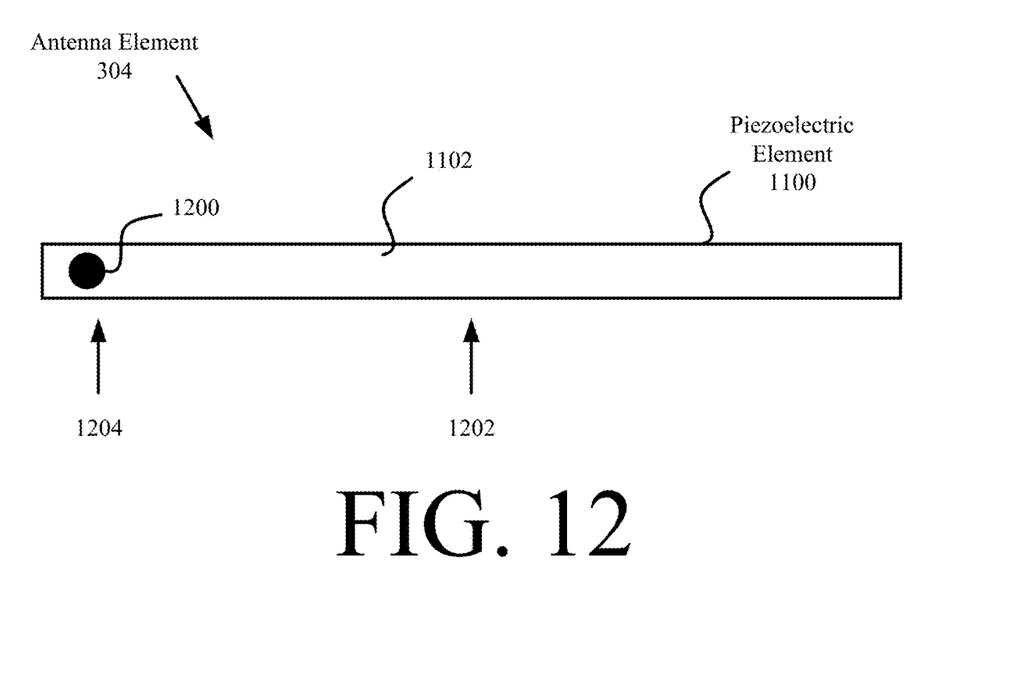
FIG. 12 is a bottom view of the antenna element shown in FIG. 3.
Figure 13:
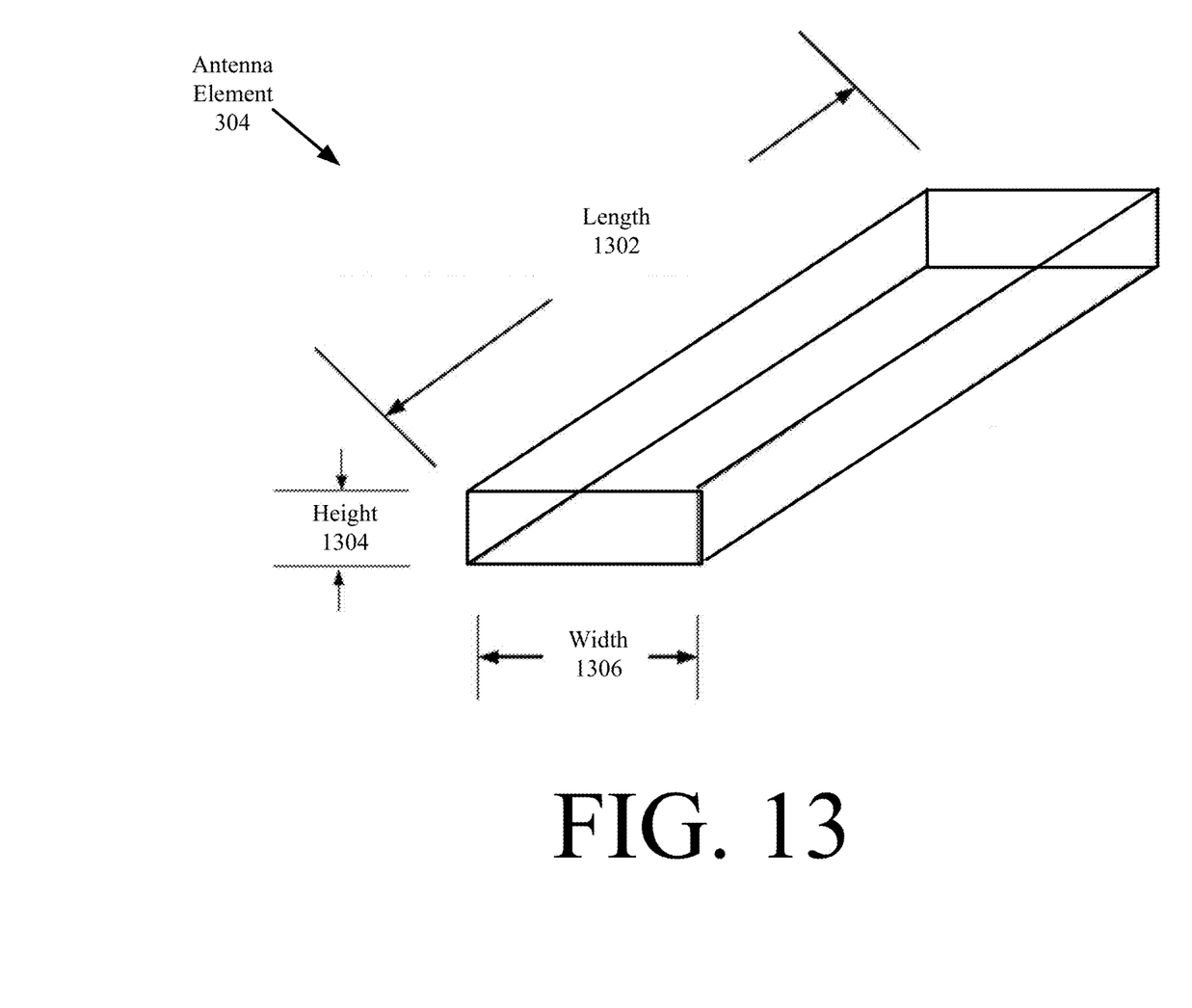
FIG. 13 is a perspective view of the antenna element shown in FIG. 3.

Referring now to FIGS. 11-13, there are provided illustrations that are useful for understanding the antenna element 304. The antenna element 304 comprises a solid electrodeformative element 1100 that is ground to size in order to operate at a given frequency (e.g., 50 kHz to 200 kHz). The electrodeformative element 1100 is formed of an electrodeformative material that mechanically vibrates when radio waves are applied thereto. The electrodeformative material includes, but is not limited to, lead zirconate titanate, barium titanate, metallic oxide-based materials, a quartz material, ceramics, and/or any other material with elongate polarized molecules. The electrodeformative element is shown as having a solid rectangular bar shape with a length 1302, a height 1304 and a width 1306. The length L (in inches) can be defined by the following Mathematical Equation (1).

$$L = 1\lambda_{sound} = c/f = (1.97 \times 10^5)/(\text{Freq. in Hz}) \quad (1)$$

The height H can be defined by the following Mathematical Equation (2).

$$H = 0.094 \cdot L \quad (2)$$

The width W can be defined by the following Mathematical Equation (3).

$$W = 0.19 \cdot L \quad (3)$$

Each frequency has different sized solid rectangular bar shape associated therewith. The present solution is not limited in this regard. The electrodeformative element can have other shapes selected in accordance with a given application.

Two electrical contacts 1102, 1104 are disposed on one of the four elongate sidewalls of the electrodeformative element 1100. The electrical contacts can be disposed via a sputtering process, a metallization process, a printing process, or other disposition process in a vacuum tank. The electrical contacts 1102, 1104 are formed of a conductive material such as metal (e.g., silver). The distance 1106 between the electrical contacts 1102, 1104 sets the driving resistance (e.g., 50 Ohms) that the antenna 202 provides and impedance matches the antenna's electrical characteristics to those of the communication device electronics. The further apart the electrical contacts are from each other the higher the induced voltage and the higher the voltage pick-up, i.e., the resistance is increased when the distance 1106 is increased and the resistance is decreased when the distance 1106 is decreased. The resistance provided by the antenna 202 can be adjusted by changing the distance between the electrical contacts.

Notably, two corresponding electrical contacts 600, 602 are provided in the housing 302 as shown in FIG. 6. The electrical contacts 600, 602 are disposed on a surface 624 of the housing 302 at locations where they will come in contact with the electrical contacts 1102, 1104 when the antenna element 304 is disposed in the housing 302. The electrical contacts 600, 602 include, but are not limited to, leaf springs, elastomeric contacts, spring tampers, or other electrical pressure contacts. Traces 626 are printed on the sidewall 626 of the housing 302 that electrically connect the electrical contacts 600, 602 to the transmission line electrical contacts 306, 308. Electric charge produced on the surface of the electrodeformative element 1000 is harvested via the electrical contacts 600, 602, 306, 308, 1102, 1104 and traces 626. The harvested energy is provided to the communication device via the transmission line 310.

As shown in FIG. 12, a mechanical tuning mass 1200 may optionally be coupled to the electrodeformative element 1100 to decrease an operating frequency of the electrodeformative element 1100. Conversely, some of the electrodeformative material can be removed or scrapped off of the electrodeformative element 1100 to increase the operating frequency of the electrodeformative element 1100.

The mechanical tuning mass 1200 has the least effect on the electrodeformative element's operating frequency when placed in the center 1202 of the electrodeformative element 1100, and the greatest effect on the electrodeformative element's operating frequency when placed at an end 1204 of the electrodeformative element 1100. The mechanical tuning mass 1200 includes, but is not limited to, paint, a pencil marking, a lead rubbing, a graphite rubbing, a solder rubbing, an adhesively attached piece (e.g., plastic or metal piece), glue, and/or a sticker. The mechanical tuning mass 1200 can be placed on any surface of the electrodeformative element 1100.

Figure 14:
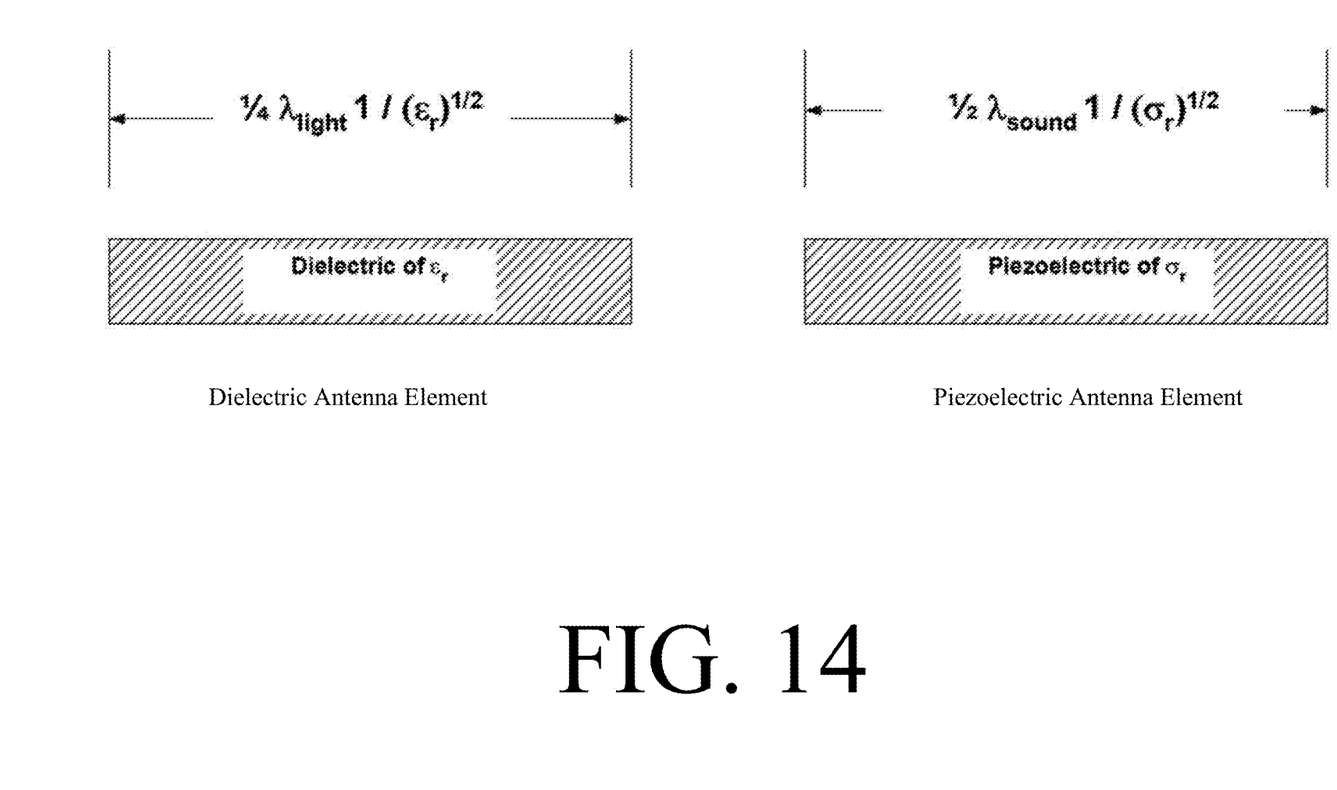
FIG. 14 is an illustration that is useful for understanding an amount of size difference between an antenna of the present solution and a convention antenna.

Referring now to FIG. 14, there is provided an illustration that is useful for understanding the overall size difference between the antenna element of the present solution and conventional dielectric antenna elements (e.g., slot dipole antenna element, a patch antenna element, and/or a transmission line antenna). The size reduction is determined by the following Mathematical Equation (4).

$$\text{Size reduction} = \frac{\frac{1}{2}\lambda_{sound} 1/(\sigma_r)^{1/2}}{\frac{1}{4}\lambda_{light} 1/(\varepsilon_r)^{1/2}} = \frac{\frac{1}{2}c_{sound\ in\ quartz}/f}{\frac{1}{4}c_{light\ in\ teflon}/f} = \frac{\frac{1}{2}c_{sound\ in\ quartz}}{\frac{1}{4}c_{light\ in\ teflon}} \quad (4)$$

where $c_{sound\ quartz}=5.7\times10^3$ m/s and $c_{light\ teflon}=1.88\times10^8$ m/s. Mathematical Equation (4) can be written as Mathematical Equation (5).

$$\text{Size reduction} = \frac{\left(\frac{1}{2}\right)5.7\times10^3\ \text{m/sec}}{\left(\frac{1}{4}\right)1.88\times10^8\ \text{m/sec}} = 0.00061 \quad (5)$$

As evident from Mathematical Equations (4) and (5), the electrodeformative element 1100 is sized in accordance with the speed of sound rather than the speed of light.

Figure 15:
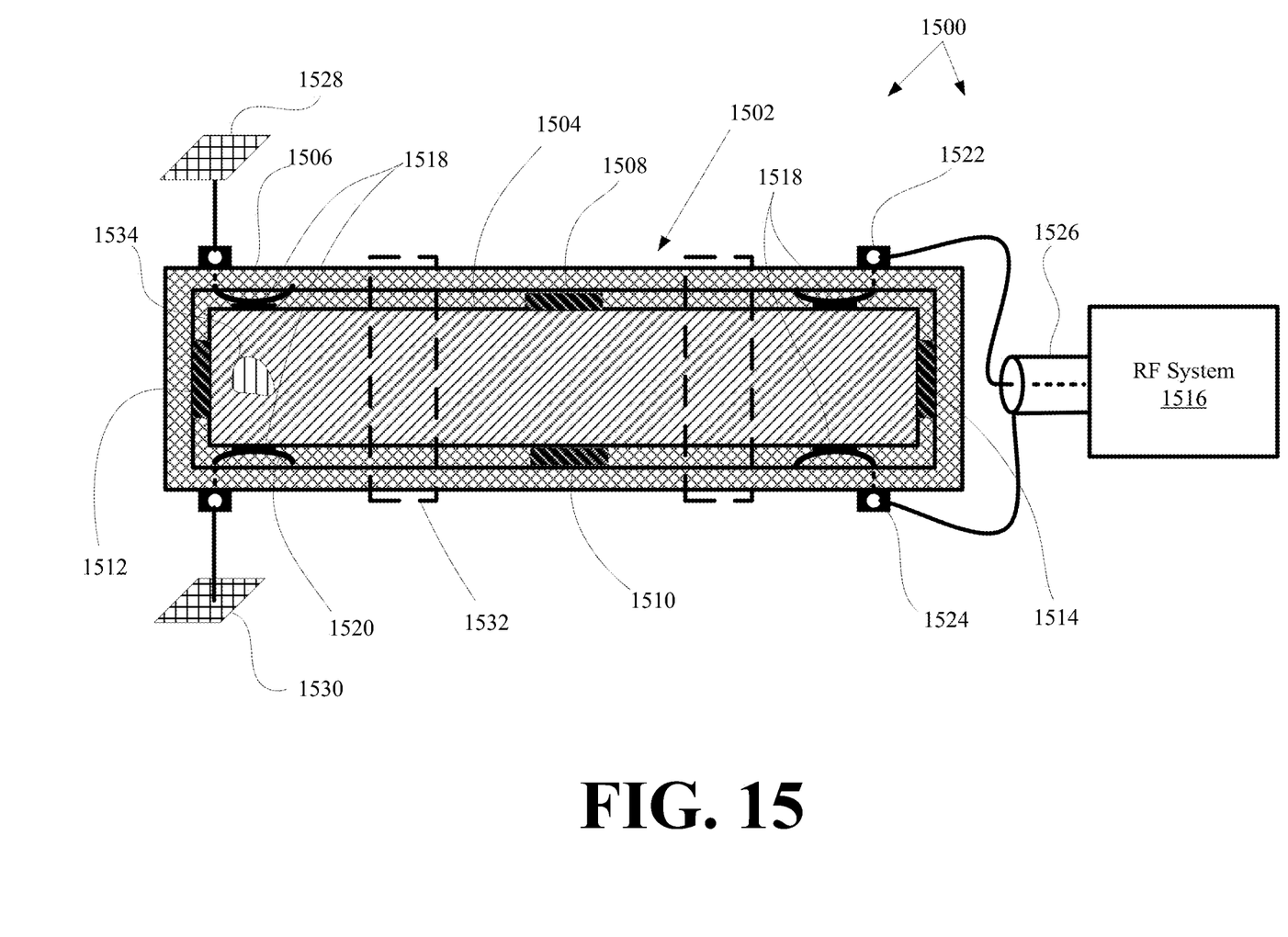
FIG. 15 provides an illustration of another illustrative system implementing the present solution.

Referring now to FIG. 15, there is provided an illustration that is useful for understanding another illustrative system 1500 in which the present solution is employed. System 1500 comprises an electroacoustic antenna 1502 coupled to an RF system 1516. The RF system 1516 includes, but is not limited to, a transceiver, a radio controlled clock, a broadcast receiver, a telemetry system, and/or an RF power source.

The electroacoustic antenna 1502 comprises an electrodeformative antenna element 1504. The electrodeformative antenna element 1504 is be suspended inside a dielectric frame 1506, for example, by resilient pads 1508, 1510, 1512, 1514. One or more retention clips 1532 are snapped onto the dielectric frame 1506 to retain the electrodeformative antenna element 1504 in its suspended position. The electrodeformative antenna element 1504 may comprise an elongate rectangular bar of lead zirconium titanate, barium titanate, strontium titanate, or quartz.

The dielectric frame 1506 may be formed of an ABS plastic or other insulator. The resilient pads 1508-1514 may include an elastomer such as foam rubber. Electrically conductive pads 1518 are present on the surface of the electrodeformative antenna element 1504, and may comprise a metallic deposition layer disposed on the electrodeformative antenna element's outer surface over small areas. Drive spring contacts 1520 (e.g., phosphor bronze or beryllium copper arms) are used to make contact to the electrical drive pads 1518. Electrical terminals 1522, 1524 may be contagious portions with the drive spring contacts 1520, and provide for the attachment of transmission line 1526 (e.g., a coaxial cable, wire leads, a twisted pair, or a PWB trace) to the electrodeformative antenna element 1504. RF system 1516 electrically connects to the electroacoustic antenna 1502 via the transmission line 1526.

Drive spring contacts 1520 can be optional components to provide conductive electrical connection to auxiliary conductive members 1528, 1530 (e.g., a wire, a trace, or metallic patch conductive members). The auxiliary conductive members 1528, 1530 are included to offer a trade between increased gain, radiation efficiency and size.

Notably, the electrodeformative antenna element 1504 may be operable without auxiliary conductive members 1528, 1530 depending on signal amplitude requirements, as for instance a trade exists between the RF system 1516 size, electrodeformative antenna element size, and signal amplitude.

The operation of system 1500 will now be described. In a receive mode of operation, an incident electromagnetic wave passes over the electrodeformative element element 1504. The electromagnetic wave contains a magnetic field component and an electric field component. Testing has shown that the passing wave acts to produce a separation of electric charge across one or more surfaces of the electrodeformative antenna element 1504. In other words, the electrodeformative antenna element 1504 converts some of the radio wave energy to an electric potential or voltage at the electrodeformative antenna element's surface. This converted energy is harvested at drive spring contacts 1520 and conductively conveyed to the RF system 1516. Thus, the electroacoustic antenna element 1504 usefully provides a transducer or antenna function for the reception of radio waves. The electrodeformative antenna element 1504 is also a reciprocal device so it may be used for transmitting applications in reverse: if the RF system 1516 sources and applies an RF electric current to the electrodeformative antenna element 1504 then it also produces a transmitted radio wave.

The electoacoustic antenna 1502 implements a method for impedance adjustment (e.g., more particularly, adjustment for a needed circuit resistance value in ohms). This impedance adjustment is achieved by an adjustment of the drive spring contact's location along the electrodeformative antenna element 1504. A location near an end of the electrodeformative antenna element 1504 produces a higher resistance and a location near the center of the electrodeformative antenna element 1504 produces a lower resistance. Advantageously, the drive spring contact location may be placed to provide an N-ohm resistance (e.g., a 50-ohm resistance).

A tuning mass 1534 may optionally be disposed on the electrodeformative antenna element 1504. The tuning mass 1534 can include, but is not limited to, a drop of paint, an adhesive deposition, or an adhesively attached metal puck. The tuning mass 1534 provides a way to adjust an operating frequency. The operating frequency is adjusted by disposing the tuning mass 1534 on the electrodeformative antenna element 1504 at a given location along the long axis of the electrodeformative antenna element. Lower operating frequencies occur when the tuning mass 1534 is placed near the drive spring contacts 1520 and high operating frequencies occur when the tuning mass 1534 is placed towards the center of the electrodeformative antenna element 1504. Another means of electrodeformative antenna frequency adjustment is ablation, for example, an electrodeformative antenna material may be removed from one or more faces of the electrodeformative antenna element 1504 by abrasive grinding, acid etching, laser action, or otherwise.

Testing has demonstrated that electrodeformative antenna element 1504 has useful properties of transmission and reception and valuable efficiency relative small physical size. While not binding the present solution to any specific theory of operation, it is thought that the electrodeformative antenna element 1504 may have long polarized molecules internally that seek to align themselves with ambient electric fields. The electric field causes long polarized molecule alignment which may in turn lead to mechanical dimension changes in the electrdoformative antenna element 1504, electrodeformative antenna element acoustic motions, and the formation of electrdoformative antenna element surface electric potentials. Electrons are squeezed to the surface so to speak. Thus, many synergistic mechanisms can be at play.

By virtue of the electrodeformative antenna element's mechanical response to incident radio waves, sympathetic mechanical or acoustic wave occurs in the electrodeformative antenna element 1504. In other words, vibration occurs in the electrodeformative antenna element as the radio wave passes by the same. The electrodeformative antenna element vibration necessarily occurs at speed of the sound in the electrodeformative antenna element material. The speed of sound in the illustrative lead zirconium titanate material of the electrodeformative antenna element may be about 2100 meters/second. This is much slower than the speed of a radio wave as radio waves travel at the speed of light. The ratio between the radio wave and the sound wave in the electrodeformative antenna element is approximately $V_{light}/V_{sound} = c/2100 = 3.0 \times 10^8/2100 = 142,860$. Thus, the conversion function of the radio wave into an induced mechanical wave in the electrodeformative antenna element causes a great size reduction relative to conventional metal based antennas. For instance, a metal half wave dipole antenna for 100 kHz would be about 4900 feet long. Further, the electrodeformative antenna element has superior efficiency, gain, and tuning stability relative a similarly sized copper antenna. The relative permittivity of the lead zirconium material can be between 300 and 3000.

Figure 16:
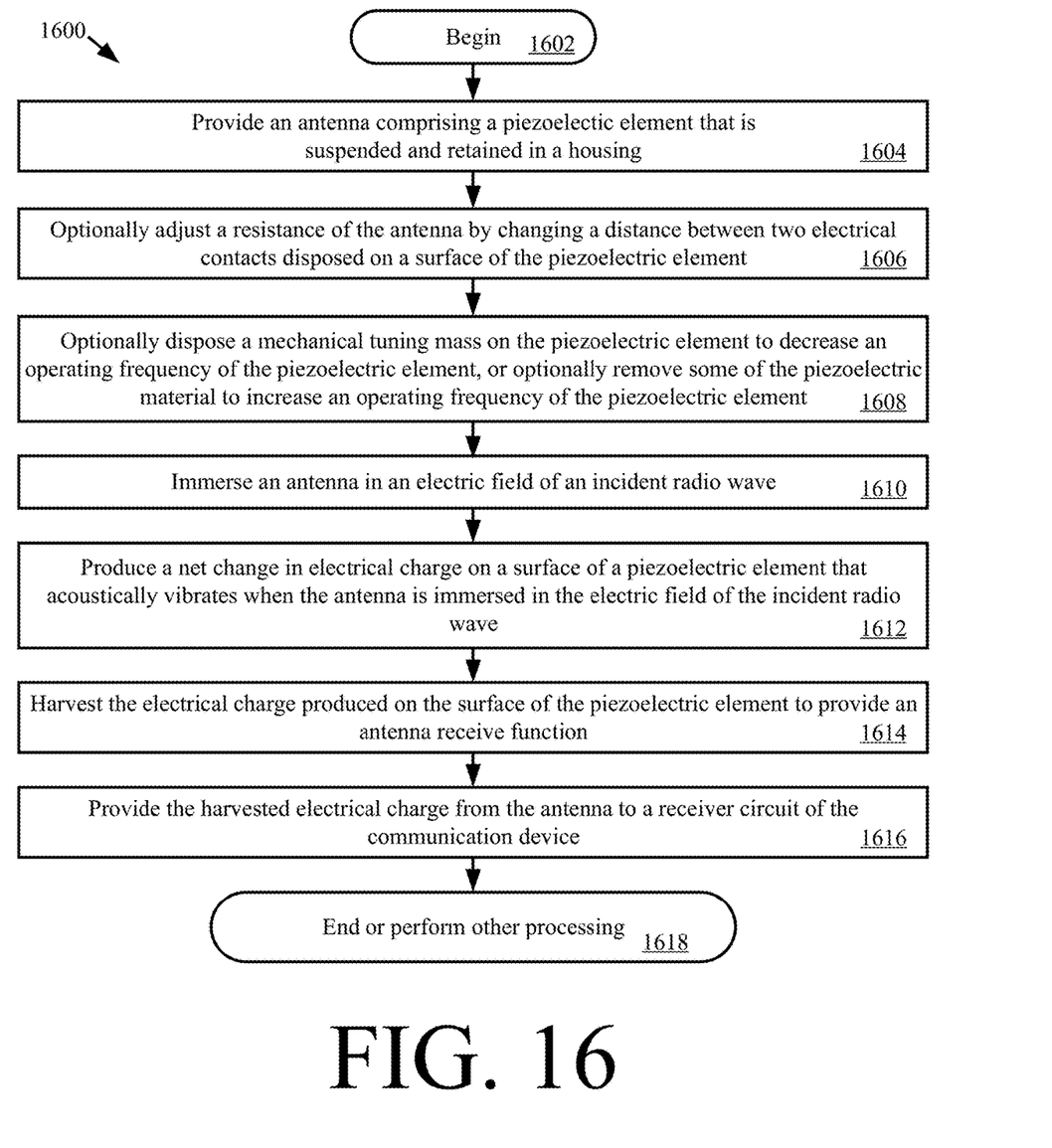
FIG. 16 is a method for operating a communications device.

Referring now to FIG. 16, there is provided a flow diagram of an illustrative method 1600 for operating a communications device (e.g., communication device $102_1$, $102_2$ of FIG. 1 or 200 of FIG. 2). Method 1600 begins with 1602 and continues with 1604 where an antenna (e.g., antenna 202 of FIGS. 2-13) is provided in 1604. The antenna comprises an electrodeformative element (e.g., electrodeformative element 1104 of FIGS. 11-13) that is suspended and retained in a housing (e.g., housing 302 of FIGS. 3-10).

In optional 1606, the resistance of the antenna is adjusted by changing a distance between two electrical contacts (e.g., electrical contacts 1102, 1104 of FIG. 11) disposed on a surface of the electrodeformative element. This can be achieved by: removing a portion of one or both electrical contact material from the electrodeformative element; or entirely removing the electrical contacts and depositing new electrical contacts on the electrodeformative element. In optional 1608, the operating frequency of the electrodeformative element is increased or decreased. The operating frequency is decreased by disposing a mechanical tuning mass (e.g., mechanical tuning mass 1200 of FIG. 12) on the electrodeformative element. The operating frequency is increased by removing some of the electrodeformative material from the electrodeformative element.

Next in 1610, the antenna is immersed in an electric field of an incident radio wave. The electrodeformative element of the antenna acoustically vibrates when the antenna is immersed in the electric field of the incident radio wave. Accordingly, a net change in electrical charge on a surface of a electrodeformative element (e.g., electrodeformative element 1104 of FIGS. 11-13) is produced in 1612. The electrical charge produced on the surface of the electrodeformative element is harvested in 1614 to provide an antenna receive function. The harvested electrical charge is provided from the antenna to a receiver circuit (e.g., receiver circuit 208 of FIG. 2) of the communication device, as shown by 1616. Subsequently, 1618 is performed where method 1600 ends or other processing is performed (e.g., return to 1606, 1608 or 1610).

Although the present solution has been illustrated and described with respect to one or more implementations, equivalent alterations and modifications will occur to others skilled in the art upon the reading and understanding of this specification and the annexed drawings. In addition, while a particular feature of the present solution may have been disclosed with respect to only one of several implementations, such feature may be combined with one or more other features of the other implementations as may be desired and advantageous for any given or particular application. Thus, the breadth and scope of the present solution should not be limited by any of the above described embodiments. Rather, the scope of the present solution should be defined in accordance with the following claims and their equivalents.

What is claimed is:

1. A method for operating a communication device, comprising:
    immersing an antenna in an electric field of an incident radio wave;
    producing a net change in electrical charge on a surface of an electrodeformative element that acoustically vibrates when the antenna is immersed in the electric field of the incident radio wave;
    harvesting the electrical charge produced on the surface of the electrodeformative element to provide an antenna receive function; and
    providing the harvested electrical charge from the antenna to a receiver circuit of the communication device;
    wherein the electrodeformative element is acoustically suspended in a housing of the antenna by a plurality of suspension members.

2. The method according to claim 1, wherein the communication device is a navigation receiver, a radio, or a smart phone.

3. The method according to claim 2, wherein the navigation receiver is an eLoran receiver.

4. The method according to claim 1, wherein a frequency of the radio wave is between 50 kHz and 200 kHz.

5. The method according to claim 1, wherein the plurality of suspension members comprise at least one of a coil spring, a wire carrier, a compressible pad and an elastomeric element.

6. The method according to claim 1, wherein at least one of said suspension members resides on all sides of the electrodeformative element.

7. The method according to claim 1, wherein the electrodeformative element comprises lead zirconium titanate in a bulk vibration mode.

8. A method for operating a communication device, comprising:
    immersing an antenna in an electric field of an incident radio wave;
    producing a net change in electrical charge on a surface of an electrodeformative element that acoustically vibrates when the antenna is immersed in the electric field of the incident radio wave;
    harvesting the electrical charge produced on the surface of the electrodeformative element to provide an antenna receive function;
    providing the harvested electrical charge from the antenna to a receiver circuit of the communication device; and
    using at least one sidewall of the antenna's housing to directly (1) facilitate a retention of the electrodeformative element in the housing and (2) suspend the electrodeformative element in the housing.

9. A method for operating a communication device, comprising:
    immersing an antenna in an electric field of an incident radio wave;

producing a net change in electrical charge on a surface of an electrodeformative element that acoustically vibrates when the antenna is immersed in the electric field of the incident radio wave;

harvesting the electrical charge produced on the surface of the electrodeformative element to provide an antenna receive function;

providing the harvested electrical charge from the antenna to a receiver circuit of the communication device; and adjusting a resistance of the antenna by changing a distance between two electrical contacts disposed on a surface of the electrodeformative element.

10. A method for operating a communication device, comprising:

immersing an antenna in an electric field of an incident radio wave;

producing a net change in electrical charge on a surface of an electrodeformative element that acoustically vibrates when the antenna is immersed in the electric field of the incident radio wave;

harvesting the electrical charge produced on the surface of the electrodeformative element to provide an antenna receive function;

providing the harvested electrical charge from the antenna to a receiver circuit of the communication device; and disposing a mechanical tuning mass on the electrodeformative element to decrease an operating frequency of the electrodeformative element.

11. The method according to claim 10, wherein the mechanical tuning mass comprises paint, a pencil marking, a lead rubbing, a graphite rubbing, a solder rubbing, an adhesively attached piece, glue or a sticker.

12. An antenna for receiving radio waves, comprising:

a housing;

an electrodeformative element that is disposed in the housing and vibrates when the antenna is immersed in an electric field of an incident radio wave; and electrical elements that harvest an electrical charge produced on a surface of the electrodeformative element when the electrodeformative element vibrates to provide an antenna receive function;

wherein the electrodeformative element is acoustically suspended in the housing by a plurality of suspension members.

13. The antenna according to claim 12, further comprising a transmission line to facilitate a provision of the harvested electrical charge from the antenna to a receiver circuit of a communication device.

14. The antenna according to claim 13, wherein the communication device is a navigation receiver, a radio, or a smart phone.

15. The antenna according to claim 14, wherein the navigation receiver is an eLoran receiver.

16. The antenna according to claim 12, wherein a frequency of the incident radio wave is between 50 kHz and 200 kHz.

17. The antenna according to claim 12, wherein the plurality of suspension members comprise at least one of a coil spring, a wire carrier, a compressible pad and an elastomeric element.

18. The antenna according to claim 12, wherein at least one of said suspension members resides on all sides of the electrodeformative element.

19. The antenna according to claim 12, wherein the electrodeformative element comprises lead zirconium titanate in a bulk vibration mode.

20. The antenna according to claim 12, wherein the electrodeformative element is sized in accordance with a speed of sound.

21. An antenna for receiving radio waves, comprising:

a housing;

an electrodeformative element that is disposed in the housing and vibrates when the antenna is immersed in an electric field of an incident radio wave; and electrical elements that harvest an electrical charge produced on a surface of the electrodeformative element when the electrodeformative element vibrates to provide an antenna receive function;

wherein at least one sidewall of the housing directly (1) facilitates a retention of the electrodeformative element in the housing and (2) suspends the electrodeformative element in the housing.

22. An antenna for receiving radio waves, comprising:

a housing;

an electrodeformative element that is disposed in the housing and vibrates when the antenna is immersed in an electric field of an incident radio wave; and electrical elements that harvest an electrical charge produced on a surface of the electrodeformative element when the electrodeformative element vibrates to provide an antenna receive function;

wherein a resistance of the antenna is adjustable by changing a distance between two electrical contacts disposed on a surface of the electrodeformative element.

23. An antenna for receiving radio waves, comprising:

a housing;

an electrodeformative element that is disposed in the housing and vibrates when the antenna is immersed in an electric field of an incident radio wave;

electrical elements that harvest an electrical charge produced on a surface of the electrodeformative element when the electrodeformative element vibrates to provide an antenna receive function; and a mechanical tuning mass disposed on the electrodeformative element to decrease an operating frequency of the electrodeformative element.

24. The antenna according to claim 23, wherein the mechanical tuning mass comprises paint, a pencil marking, a lead rubbing, a graphite rubbing, a solder rubbing, an adhesively attached piece, glue or a sticker.

* * * * *